(12) United States Patent
Fischer et al.

(10) Patent No.: US 9,171,765 B2
(45) Date of Patent: Oct. 27, 2015

(54) INLINE RESIDUAL LAYER DETECTION AND CHARACTERIZATION POST VIA POST ETCH USING CD-SEM

(71) Applicant: GLOBALFOUNDRIES Inc., Grand Cayman (KY)

(72) Inventors: Daniel Fischer, Dresden (DE); Carsten Hartig, Meerane (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 92 days.

(21) Appl. No.: 14/186,012

(22) Filed: Feb. 21, 2014

(65) Prior Publication Data

US 2015/0243568 A1    Aug. 27, 2015

(51) Int. Cl.
*H01L 21/66*     (2006.01)
*G06T 7/00*      (2006.01)

(52) U.S. Cl.
CPC .............. *H01L 22/26* (2013.01); *G06T 7/0006* (2013.01); *G06T 2207/10061* (2013.01); *G06T 2207/30148* (2013.01)

(58) Field of Classification Search
USPC .......................................................... 438/16
See application file for complete search history.

(56) References Cited

U.S. PATENT DOCUMENTS

| | | | | |
|---|---|---|---|---|
| 7,301,645 | B2 * | 11/2007 | Wang et al. | 356/503 |
| 2002/0000550 | A1 * | 1/2002 | Yang et al. | 257/48 |
| 2004/0147131 | A1 * | 7/2004 | Kitsunai et al. | 438/710 |
| 2007/0232067 | A1 * | 10/2007 | Hirota et al. | 438/689 |
| 2008/0137078 | A1 * | 6/2008 | Lally et al. | 356/237.2 |
| 2010/0304509 | A1 * | 12/2010 | Aghababazadeh et al. | 438/17 |
| 2013/0195346 | A1 * | 8/2013 | Nagatomo et al. | 382/145 |
| 2013/0294871 | A1 * | 11/2013 | Widmann et al. | 414/222.01 |
| 2014/0206112 | A1 * | 7/2014 | Montgomery et al. | 438/16 |

OTHER PUBLICATIONS

Jaksch, "Contrast Mechanisms Low-Loss Backscattered Electrons in a Field Emission SEM", 12th European Workshop on Modern Developments and Applications in Microbeam Analysis, 2011 EMAS, 17 pages.

* cited by examiner

*Primary Examiner* — Alexander Ghyka
(74) *Attorney, Agent, or Firm* — Ditthavong & Steiner, P.C.

(57) ABSTRACT

Methods of determining an amount and/or a thickness of residual material in a via based on LL-BSE images of the material are disclosed. Embodiments include etching a plurality of vias through at least one material layer on a wafer; loading the wafer with predetermined measurement parameters in a CD-SEM; acquiring an image of each via of interest using LL-BSE imaging; quantifying grey level values of the images; characterizing residuals of the at least one material layer in each via based on the grey level values; determining an etching success rate based on the characterizing of the residuals; adjusting the etching based on the determining of the etching success rate; and repeating the steps of acquiring, quantifying, characterizing, determining, and adjusting until a desired etching success rate is achieved.

20 Claims, 2 Drawing Sheets

INLINE RESIDUAL LAYER DETECTION AND CHARACTERIZATION POST VIA POST ETCH USING CD-SEM

TECHNICAL FIELD

The present disclosure relates to a method of monitoring the formation of vias in semiconductor devices inline using a critical dimension scanning electron microscope (CD-SEM). The present disclosure is particularly applicable to the 45 nanometer (nm) technology node and beyond.

BACKGROUND

The CD-SEM is often used for inline process control. Measurements are extracted from top-down images based on secondary electron collection while scanning the specimen. However, with regular CD-SEM imaging, material dependent differentiation and quantification is not possible, as grey level variation on an area of interest, e.g., a pad area, is limited.

Further, known approaches for inline monitoring often involve optical techniques such as reflectometry, for example. However, to execute such measurements, a dedicated test pattern size of approximately 70 micrometers ($\mu m$)×70 $\mu m$, for example, needs to be placed in a sacrificial area of the chip, e.g., spot size of measurement system is 30 $\mu m$ to 50 $\mu m$. These test structures are generally non-electrical patterns. As a result, correlation to electrical parameters is difficult. In addition, due to the topographical effects and density variations across a chip, the measurement does not always represent what happened in the chip and to the pads/vias with much smaller areas. Currently, the wafer has to be brought to an analytical lab for cross sectioning and verified with destructive physical analysis, e.g., transmission electron microscopy (TEM) or cross-section scanning electron microscope (X-SEM) imaging. Consequently, the wafer is lost and the turnaround time is quite high, e.g., in the range of a week, and several thousands of wafers can be at risk as a result.

Therefore, for process monitoring and device reliability insurance for thin layers or thin films it is important to have feedback information as to whether via pads in upper back-end-of-line (BEOL) layers are opened, partially opened, or closed post etching. However, due to the particularly small size of the via pads, e.g., 9 $\mu m^2$ to 1600 $\mu m^2$, alternate measurement approaches using energy dispersive x-ray (EDX) may not yield required sensitivity as high voltages of 5 kilovolts (kV) and up are required. Moreover, thin residual layers of a few nanometers, e.g., 1 nm to 10 nm, are not easy to dissolve as the penetration depth for electrons is too high, and the main EDX signal comes from the lower layer. Further, optical film measurements also may not be an option since the pads are often too small, e.g., a minimum of 2500 $\mu m^2$ is generally required for optical approaches.

In addition, during typical via etch steps (excluding trench first via last (TVFL)), the etch stops in tetraethyl orthosilicate (TEOS) and/or BLOK layers. However, sometimes the etching depth target is not optimally reached so that excess residual TEOS and/or BLOK remains. As a result, at the final etch step, the via remains unopened, and at the fill step, contact cannot be made. Consequently, a number of wafers in progress (WIP) may be affected until the issue has been detected. Ideally, at a via-etch CD measurement step, an inspection of residual layer thickness would be desired to estimate the successful via etch process down to target depth. Moreover, depth measurement by atomic force microscopy (AFM) is not possible due to the dimensions of the vias.

A need therefore exists for methodology enabling inline determination of an amount of residual material on a via pad and a thickness of a residual layer in a via after via etch.

SUMMARY

An aspect of the present disclosure is a method of determining an amount of residual material in a via based on the grey level values of low loss back scattered electron (LL-BSE) images of the material.

Another aspect of the present disclosure is a method of determining a thickness of a residual material layer within a via based on the grey level values of an LL-BSE image of the layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: etching a plurality of vias through a material layer on a wafer; loading the wafer with predetermined measurement parameters in a CD-SEM; acquiring an image of each via of interest using LL-BSE imaging; quantifying grey level values of each image; determining a residual amount of the material layer in each via based on the grey level values; determining an etching success rate across the wafer inline based on the determining of the amount of each material layer covering each via; and adjusting the etching based on the determining of the etching success rate.

Aspects of the present disclosure include acquiring the images using a low energy beam. Other aspects include quantifying the grey level values based on histogram bins and mean and standard deviation (StdDev) values. Further aspects include determining the residual amount of the material layer in each via by comparing the histogram bins and mean and StdDev values of each image, wherein the histogram mean value decreases proportionately with an increase of the amount of the material layer in each via. Another aspect includes determining the etching success rate across the wafer inline by charting the grey level values of the images.

Another aspect of the present disclosure is a method including: etching a via in a wafer having at least one material layer; loading the wafer with predetermined measurement parameters in a CD-SEM; acquiring an image of the via of interest using LL-BSE imaging; quantifying grey level values of the image; determining a thickness of a residual material layer in the via based on the grey level values; determining an etching success rate inline based on the determined thickness of the residual material layer; and adjusting the etching based on the determining of the etching success rate.

Aspects of the present disclosure include acquiring the image using a high energy beam. Other aspects include quantifying the grey level values based on histogram bins and mean and StdDev values. Further aspects include determining the thickness of the residual material layer by comparing the histogram bins and mean and StdDev values of the image against a library of histogram bins and mean and StdDev values, wherein each library value is associated with measurement parameters and processing steps of a wafer.

A further aspect of the present disclosure is a method including: etching a plurality of vias through at least one material layer on a wafer; loading the wafer with predetermined measurement parameters in a CD-SEM; acquiring an image of each via of interest using LL-BSE imaging; quantifying grey level values of the images; characterizing residuals of the at least one material layer in each via based on the grey level values; determining an etching success rate based on the characterizing of the residuals; adjusting the etching based on the determining of the etching success rate; and repeating the steps of acquiring, quantifying, characterizing, determining, and adjusting until a desired etching success rate is achieved.

Aspects of the present disclosure include comprising acquiring the images using a low energy beam. Other aspects include quantifying the grey level values based on histogram bins and mean and StdDev values. Further aspects include characterizing the residuals to determine an amount of the residuals in the via. Another aspect includes determining the amount of the residuals in the vias by comparing the histogram bins and mean and StdDev values of each image, wherein the histogram mean value decreases proportionately with an increase of the amount of the material layers covering the via. Additional aspects include acquiring the image using a high energy beam. Other aspects include characterizing the residuals to determine a thickness of the residuals. Further aspects include determining the thickness of the residuals by comparing the histogram bins and mean and StdDev values of the image against a library of histogram bins and mean and StdDev values.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
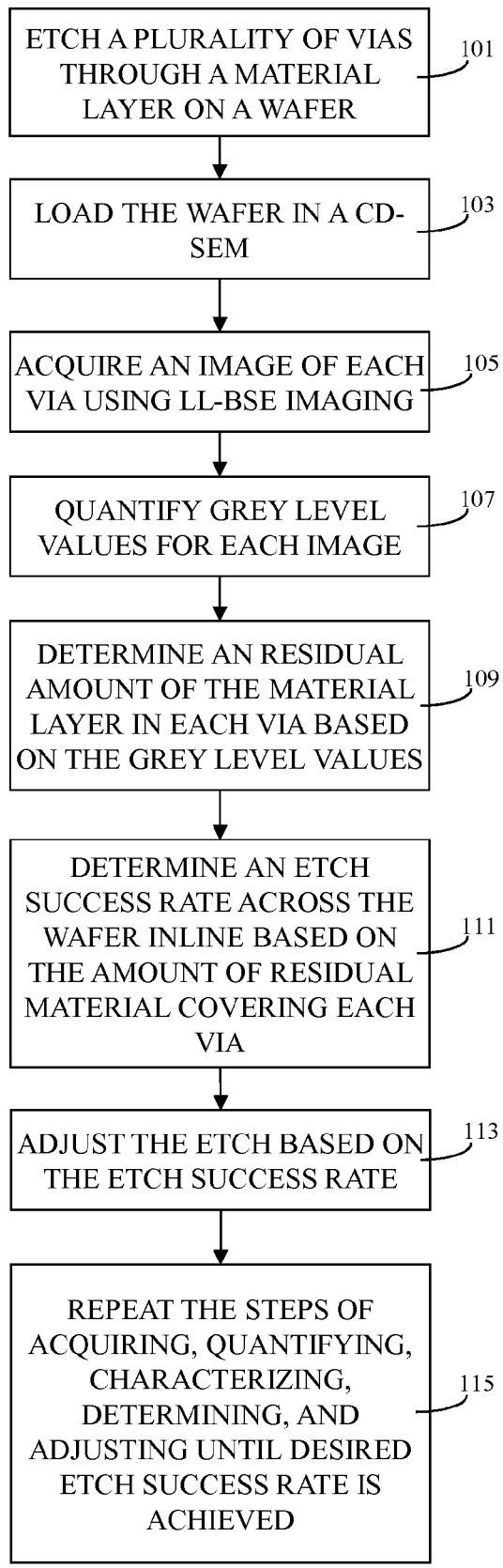
FIG. 1 illustrates a process flow for determining an amount of residual material in each via based on the grey level values of LL-BSE images of the material, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an inability to optically determine inline whether via pads in upper BEOL layers are opened, partially opened, or closed or whether excess residual TEOS and/or BLOK remains in the via post etch resulting in no contact being made, all attendant upon regular CD-SEM imaging. By using LL-BSE imaging, a technique known from material analytic SEMs, material sensitive images can be generated while reducing topographical information to a minimum. With this imaging mode, materials of higher atomic orders such as copper (Cu) can clearly be differentiated by histogram comparison from surrounding materials containing silicon oxide ($SiO_2$) or silicon nitride ($Si_3N_4$), for example, due to high contrast differences. However, even material combinations such as $SiO_2$ on or next to Aluminum (Al) with low difference in atomic number can be clearly differentiated by use of LL-BSE imaging mode and following analysis of histogram values. The present disclosure is not limited to CD-SEM only, but can be advanced to use a defect review scanning electron microscope (DR-SEM) as an inline monitoring system as well.

Methodology in accordance with embodiments of the present disclosure includes etching a plurality of vias through at least one material layer on a wafer. The wafer is loaded with predetermined measurement parameters in a CD-SEM. An image is acquired of each via using LL-BSE imaging. The grey level values of the images are quantified. The residuals of the at least one material layer in each via are characterized based on the grey level values. An etching success rate is determined based on the characterizing of the residuals. The etching is adjusted based on the determining of the etching success rate. The steps of acquiring, quantifying, characterizing, determining, and adjusting are repeated until a desired etching success rate is achieved.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 1 illustrates a process flow for determining an amount of residual material in each via based on the grey level values of LL-BSE images of the material, in accordance with an exemplary embodiment. Adverting to step 101, a plurality of vias, e.g., each 9 $\mu m^2$ to 1600 $\mu m^2$, are etched through a material layer on a wafer, e.g., $SiO_2$ or $Si_3N_4$, down to a conductive layer, e.g., Cu. Next, the wafer with predetermined measurement parameters known as an SEM recipe is loaded in a CD-SEM, as depicted in step 103. Adverting to step 105, an image of each via is then acquired using LL-BSE. In particular, the images are acquired using a low energy beam, e.g., a beam of an energy value between 200 volts (V) and 1 kilovolt (kV). As a result of the very low energy and surface sensitive setup, the depth resolution allows detection by the CD-SEM down to a layer thickness of a few angstroms. Using LL-BSE imaging, as opposed to regular CD-SEM images, filters out lower energy electrons, i.e., electrons reflected from insulator cover materials, and therefore provides the requisite surface and material sensitivity.

The acquired images contain grey level information generated by reflected electrons, i.e., the back scattered electrons (BSE). The grey level information or grey level values are then quantified based on histogram bins and mean and StdDev values, as depicted in step 107. In particular, for materials with a higher material atomic number and density, the amount of BSE is higher than for materials with a lower atomic number and density and the amount of BSE is directly translated to specific grey values in the images. For example, metal areas, e.g., Cu, covered with insulator materials, e.g., $SiO_2$ or $Si_3N_4$, appear much darker than uncovered metal surfaces. Adverting to step 109, the residual amount of the material layer, e.g., an insulator layer, in each via is determined by comparing the histogram bins and mean and StdDev values of each image. More specifically, the histogram mean values decrease proportionately with an increase in the amount of the material layer in each via. For example, on a wafer an opened or fully exposed via may have a mean value and a StdDev value of 174.447 and 19.842, respectively, and a closed or fully covered via may have a mean value and a StdDev value of 77.690 and 4.304, respectively. On the same wafer, the mean and StdDev values for an increasing degree of partially closed vias may range, for example, between 167.567 and 38.791 and 136.112 and 40.53, respectively. It is contemplated that the histogram analysis may be executed on the tool platform (to be developed by a vendor) or an offline utility. Thereafter, the etching success rate across the wafer is determined inline by charting the grey level values of the LL-BSE images, as depicted in step 111. Adverting to step 113, the etching may then be adjusted, if needed, based on the determined etch success rate in step 111 to prevent additional wafers from being affected. Further, the steps of acquiring, quantifying, characterizing, determining, and adjusting may be repeated until a desired etch success rate is achieved, as depicted in step 115.

Figure 2:
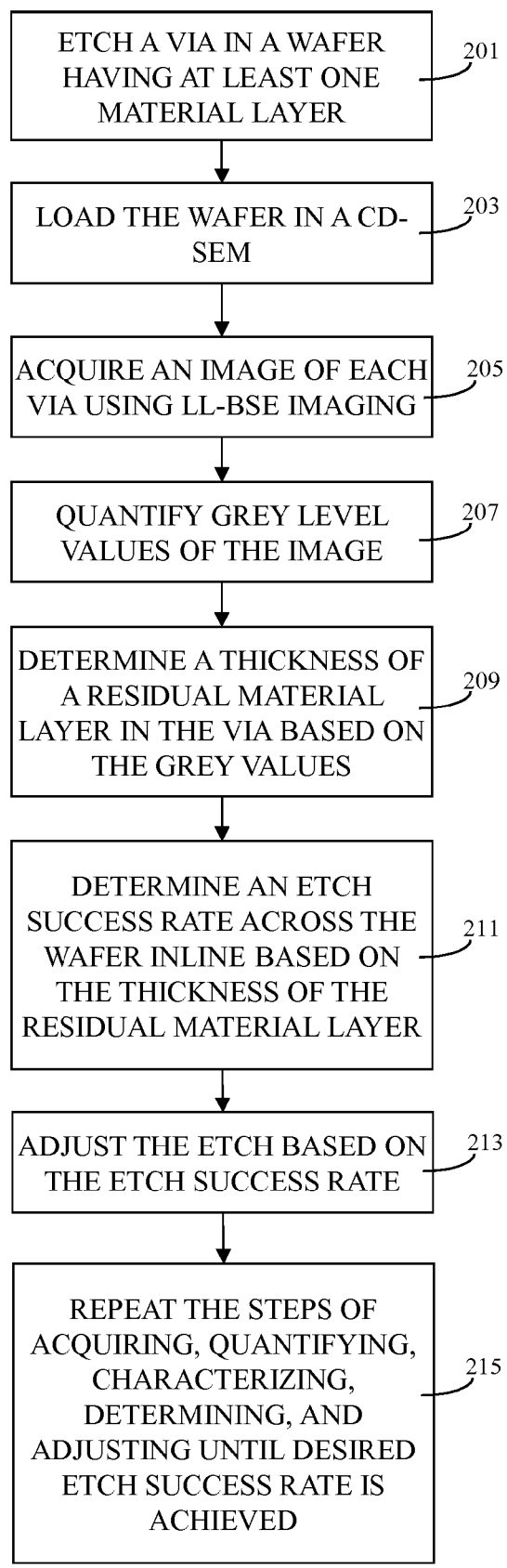
FIG. 2 illustrates a process flow for determining a thickness of a residual material layer within a via based on the grey level values of an LL-BSE image of the layer, in accordance with an exemplary embodiment.

FIG. 2 illustrates a process flow for determining a thickness of a residual material layer within a via based on the grey level values of an LL-BSE image of the layer, in accordance with an exemplary embodiment. Adverting to step 201, a via is etched in a wafer having at least one material layer, e.g., TEOS and/or BLOK. Next, similar to step 103, the wafer with predetermined measurement parameters known as an SEM recipe is loaded in a CD-SEM, as depicted step 203. Adverting to step 205, an image of the via using LL-BSE is then acquired by the CD-SEM. In particular, the image is acquired using a high energy beam, e.g., a beam of an energy value between 1 kV and 20 kV, which is required to penetrate through the at least one material layer. Similar to step 107, the grey level information or grey level values of the image are then quantified, as depicted in step 207. In particular, the grey level values are quantified based on histogram bins and mean and StdDev values. Moreover, the amount of collected BSE translates to grey value changes associated with the thickness information. For example, because the remaining amount of reflected BSE from a metal surface depends on the on-top insulator thickness, i.e., TEOS and/or BLOK thickness, the thicker the insulator, the fewer BSE that are reflected.

Adverting to step 209, the thickness of the residual TEOS and/or BLOK, is determined based on the grey level values. For example, the thickness of residual material layer may be determined by comparing the histogram bins and mean and StdDev values against a library of histogram bins and mean and StdDev values. In particular, each library value is associated with measurement parameters and processing steps of a previously measured wafer. The etching success rate may then be determined inline based on the thickness of the residual material layer, as depicted in step 211. Adverting to step 213, similar to step 113, the etching of the via may then be adjusted, if needed, based on the determined etching success rate in step 211. Further, similar to step 115, the steps of acquiring, quantifying, characterizing, determining, and adjusting may be repeated until a desired etch success rate is achieved, as depicted in step 215.

The embodiments of the present disclosure can achieve several technical effects including inline measuring of the residual material removal from a via and/or reaching a target depth post via etch directly after the process step. As a result, the reaction time to failures caused by process fluctuations is significantly reduced from weeks to hours, which is useful for process control. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices having vias, particularly for 45 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    etching a plurality of vias through a material layer on a wafer;
    loading the wafer with predetermined measurement parameters in a critical dimension scanning electron microscope (CD-SEM);
    acquiring an image of each via of interest using Low Loss Back Scattered Electron (LL-BSE) imaging;
    quantifying grey level values of each image;
    determining a residual amount of the material layer in each via based on the grey level values;
    determining an etching success rate across the wafer inline based on the determining of the amount of each material layer covering each via; and
    adjusting the etching based on the determining of the etching success rate.

2. The method according to claim 1, comprising acquiring the images using a low energy beam.

3. The method according to claim 1, comprising quantifying the grey level values based on histogram bins and mean and standard deviation (StdDev) values.

4. The method according to claim 1, comprising determining the residual amount of the material layer in each via by comparing the histogram bins and mean and StdDev values of each image.

5. The method according to claim 4, wherein the histogram mean value decreases proportionately with an increase of the amount of the material layer in each via.

6. The method according to claim 1, comprising determining the etching success rate across the wafer inline by charting the grey level values of the images.

7. A method comprising:
    etching a via in a wafer having at least one material layer;
    loading the wafer with predetermined measurement parameters in a critical dimension scanning electron microscope (CD-SEM);

acquiring an image of the via of interest using Low Loss Back Scattered Electron (LL-BSE) imaging;
quantifying grey level values of the image;
determining a thickness of a residual material layer in the via based on the grey level values;
determining an etching success rate inline based on the determined thickness of the residual material layer; and
adjusting the etching based on the determining of the etching success rate.

8. The method according to claim 7, comprising acquiring the image using a high energy beam.

9. The method according to claim 7, comprising quantifying the grey level values based on histogram bins and mean and standard deviation (StdDev) values.

10. The method according to claim 7, comprising determining the thickness of the residual material layer by comparing the histogram bins and mean and StdDev values of the image against a library of histogram bins and mean and StdDev values.

11. The method according to claim 10, wherein each library value is associated with measurement parameters and processing steps of a wafer.

12. A method comprising:
etching a plurality of vias through at least one material layer on a wafer;
loading the wafer with predetermined measurement parameters in a critical dimension scanning electron microscope (CD-SEM);
acquiring an image of each via of interest using Low Loss Back Scattered Electron (LL-BSE) imaging;
quantifying grey level values of the images;
characterizing residuals of the at least one material layer in each via based on the grey level values;
determining an etching success rate based on the characterizing of the residuals;
adjusting the etching based on the determining of the etching success rate; and
repeating the steps of acquiring, quantifying, characterizing, determining, and adjusting until a desired etching success rate is achieved.

13. The method according to claim 12, comprising acquiring the images using a low energy beam.

14. The method according to claim 12, comprising quantifying the grey level values based on histogram bins and mean and standard deviation (StdDev) values.

15. The method according to claim 12, comprising characterizing the residuals to determine an amount of the residuals in the via.

16. The method according to claim 15, comprising determining the amount of the residuals in the vias by comparing the histogram bins and mean and StdDev values of each image.

17. The method according to claim 16, wherein the histogram mean value decreases proportionately with an increase of the amount of the material layers covering the via.

18. The method according to claim 12, comprising acquiring the image using a high energy beam.

19. The method according to claim 12, comprising characterizing the residuals to determine a thickness of the residuals.

20. The method according to claim 19, comprising determining the thickness of the residuals by comparing the histogram bins and mean and StdDev values of the image against a library of histogram bins and mean and StdDev values.

* * * * *